United States Patent [19]
Wolters et al.

[11] Patent Number: 5,366,928
[45] Date of Patent: Nov. 22, 1994

[54] METHOD OF MANUFACTURING A SEMICONDUCTOR DEVICE, IN WHICH A METAL CONDUCTOR TRACK IS PROVIDED ON A SURFACE OF A SEMICONDUCTOR BODY

[75] Inventors: Robertus A. M. Wolters; Alexander G. M. Jonkers, both of Eindhoven, Netherlands

[73] Assignee: U.S. Philips Corporation, New York, N.Y.

[21] Appl. No.: 73,244

[22] Filed: Jun. 4, 1993

Related U.S. Application Data

[63] Continuation of Ser. No. 290,924, Dec. 28, 1988, abandoned.

[30] Foreign Application Priority Data

Jan. 29, 1988 [NL] Netherlands ......................... 8800220

[51] Int. Cl.$^5$ ................................. H01L 21/283
[52] U.S. Cl. ................................. 437/192; 437/193; 437/195; 437/200; 148/DIG. 1; 148/DIG. 15; 257/764
[58] Field of Search ............... 437/238, 189, 192, 195, 437/200, 193; 148/DIG. 118, DIG. 1; 257/764

[56] References Cited

U.S. PATENT DOCUMENTS

| | | | |
|---|---|---|---|
| 3,806,361 | 4/1974 | Lehner | 148/DIG. 125 |
| 3,859,127 | 1/1975 | Lehner | 148/DIG. 125 |
| 4,086,613 | 4/1978 | Biet et al. | 148/DIG. 125 |
| 4,106,051 | 8/1978 | Dolmer et al. | 148/DIG. 147 |
| 4,267,012 | 5/1981 | Pierce et al. | 156/643 |
| 4,491,860 | 1/1985 | Lim . | |
| 4,558,507 | 12/1985 | Okabayashi et al. | 148/DIG. 19 |
| 4,567,058 | 1/1986 | Koh | 156/643 |
| 4,570,328 | 2/1986 | Price et al. | 437/193 |
| 4,622,735 | 11/1986 | Shibata | 148/DIG. 147 |
| 4,624,737 | 11/1986 | Shimbo | 437/189 |
| 4,761,386 | 8/1988 | Buynoski | 148/DIG. 125 |
| 4,965,218 | 10/1990 | Geissberger et al. | 437/41 |

FOREIGN PATENT DOCUMENTS

| | | | |
|---|---|---|---|
| 0190070 | 8/1986 | European Pat. Off. . | |
| 54-10668 | 1/1979 | Japan | 148/DIG. 1 |
| 0046644 | 3/1983 | Japan . | |
| 0077098 | 5/1983 | Japan . | |
| 0119669 | 7/1983 | Japan . | |
| 0111152 | 6/1984 | Japan . | |
| 0089671 | 5/1986 | Japan . | |

OTHER PUBLICATIONS

Panko, et al., Appl. Phys. Lett., 34(2), 15 Jan. 1979, pp. 156–157.
Weitzel et al., Thin Solid Films, 75 (1981), pp. 143–150.
Wittmer, et al., Thin Solid Films, 93, 1982, 397–405.
Sze, S. VLSI Technology, 1983, McGraw-Hill, pp. 106–111.
Wolf, S., et al., Silicon Processing, 1986, Lattice Press, pp. 182–185.

*Primary Examiner*—T. N. Quach
*Attorney, Agent, or Firm*—Norman N. Spain

[57] ABSTRACT

A method of manufacturing a semiconductor device is set forth comprising a semiconductor body (1) having a surface (2) adjoined by a semiconductor region (3) and a field oxide region (4) surrounding this region, on which surface (2) is provided a metal layer (13), in which a conductor track (17, 18) is formed, after which an isolating layer of silicon oxide (19) is deposited over the conductor track (17, 18) on the surface (2). According to the invention, before the layer of silicon oxide (19) is provided over the conductor track (17, 18), this track is provided with a top layer (16) of an oxidation-preventing material. By providing this top layer (16), it is avoided that the conductor track (17, 18) covered by silicon oxide (19) has a high electrical resistance or even an electrical interruption.

10 Claims, 2 Drawing Sheets

METHOD OF MANUFACTURING A SEMICONDUCTOR DEVICE, IN WHICH A METAL CONDUCTOR TRACK IS PROVIDED ON A SURFACE OF A SEMICONDUCTOR BODY

This is a continuation of application Ser. No. 07/290,924, filed Dec. 28, 1988, now abandoned.

BACKGROUND OF THE INVENTION

The invention relates to a method of manufacturing a semiconductor device comprising a semiconductor body having a surface adjoined by a semiconductor region and a field oxide region surrounding said region, this surface being provided with a metal layer, in which a conductor track is formed, after which an isolating layer of silicon oxide is deposited over the semiconductor track on the surface.

The conductor track can be provided so that it extends both above the semiconductor region and above the field oxide region and contacts the semiconductor region. The conductor track then contacts, for example, a source or drain zone of a field effect transistor, which is provided in the semiconductor region. The conductor track can then be further connected through a contact window in the isolating layer of silicon oxide deposited over the conductor track to a metallization layer, which is provided on the isolating layer of silicon oxide. The conductor track may also be further connected to a conductor track of polycrystalline silicon, which may also be provided on the surface of the semiconductor body. Both conductor tracks may then be covered by the isolating body. Both conductor tracks may then be covered by the isolating layer of silicon oxide. Thus, for example, a source or drain zone of a field effect transistor provided in the semiconductor region may be connected to a gate electrode of another field effect transistor to be provided in the semiconductor body. The conductor track may also be arranged, however, so that it extends only above the field oxide or only above the semiconductor region. Also in these cases, it may be used to establish different interconnections.

European Patent Application No. 190 070 discloses a method of the kind mentioned in the opening paragraph, in which the conductor track is formed in a layer of titanium, vanadium, chromium, zirconium, niobium, molybdenum, hafnium, tantalum or tungsten. The isolating layer of silicon oxide may be deposited over the conductor track on the surface of the semiconductor body by means of one of the methods known for depositing silicon oxide.

In practice, it has been found that with the use of the known method problems may arise. For example, the conductor track covered by silicon oxide may have an electrical resistance which is much larger than that which could be expected of such a metal track on account of its properties. In certain cases, it has also been found that the conductor track is then entirely interrupted. These problems especially arise if the layer of silicon oxide is deposited by means of a deposition process by which a good step coverage can be obtained. During the manufacture of semiconductor devices with current elements, such as field effect transistors having submicron dimensions, such a deposition process is very necessary, however.

SUMMARY OF THE INVENTION

The invention has inter alia for its object to improve the method mentioned in the opening paragraph so that a layer of silicon oxide can be deposited on a metal conductor track on a surface of a semiconductor body by means of a deposition process, by which a good step coverage can be obtained without the conductor track obtaining unfavourable electrical properties.

For this purpose, the method according to the invention is characterized in that, before the layer of silicon oxide is provided over the conductor track, this track is provided with a top layer of an oxidation-preventing material.

The invention is based on the recognition of the fact that a conductor track of titanium, vanadium, chromium, zirconium, niobium, molybdenum, hafnium, tantalum or tungsten readily oxidizes during deposition of a layer of silicon oxide by means of a deposition process by which a good step coverage can be obtained. During such a process, the semiconductor body is heated at a temperature exceeding 650° C., while a silicon-containing gas mixture which, in practice always contains oxidizing constituents is passed over the semiconductor body; this gas mixture either has the form of an impurity with oxygen or the form of an oxygen compound, such as, for example, in a gas mixture containing dichlorosilane. In such conditions, the metals readily oxidize. At much lower temperatures, which lie below 450° C., this oxidation practically does not happen, but at these temperatures a layer of silicon oxide having a good step coverage cannot be deposited. By the oxidation, the conductor track can be attacked in such a manner that it has a very high electrical resistance or even a complete interruption.

Due to the measure according to the invention, the oxidation of the conductor track during deposition of the isolating layer of silicon oxide is prevented.

Figure 1:
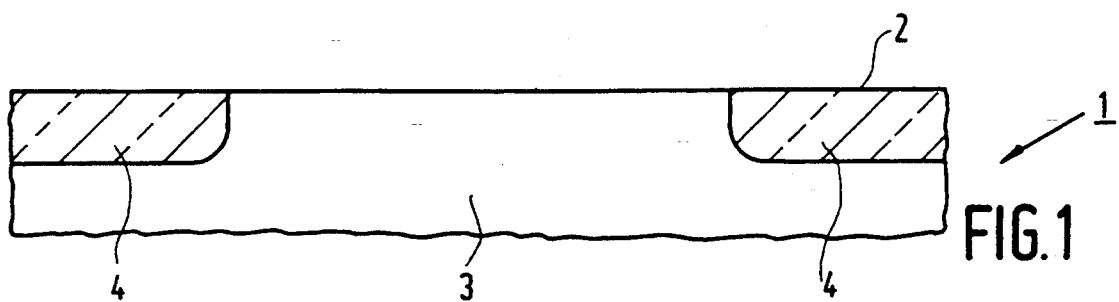
FIGS. 1, 2, 3, 4, 5, 6, 7 and 8 show diagrammatically and in cross-section a few successive stages in the manufacturer of a semiconductor device according to the method of the invention.
Figure 2:
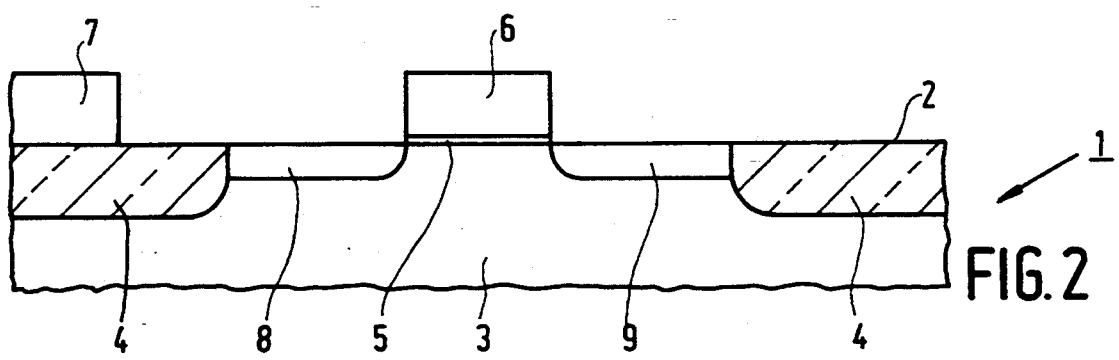

The oxidation-preventing top layer can be manufactured from silicon nitride or silicon oxide. For the reasons already mentioned above, these layers should be deposited at a low temperature, however, such as, for example, by means of a plasma deposition process. Such layers have a poor step coverage, however.

A preferred embodiment of the method according to the invention is characterized in that the conductor track is provided with a top layer of amorphous silicon as oxidation-preventing top layer. Such a layer of amorphous silicon can readily be deposited at a comparatively low temperature and with a good step coverage by means of a sputter deposition process or by means of a deposition process, in which the amorphous silicon is deposited from a vapour containing monosilane. In the latter case, the metal surface acts as a catalyst for the discharge reaction of monosilane, which thus can take place at a temperature of less than 450° C. These processes are carried out in practice in such conditions that the aforementioned metals do not oxidize. It has further been found that the top layer of amorphous silicon substantially does not oxidize during the deposition of the silicon oxide over the conductor track itself. It has also been found that this top layer is so dense that an oxidation of the underlying metal cannot be observed in practice.

Preferably, the conductor track according to the invention is provided with a top layer of amorphous silicon having a thickness of at least 3 nm. It has been found that a layer of amorphous silicon having this minimum thickness protects the underlying metal layer sufficiently from oxidation.

A method, in which according to the invention the conductor track is provided in a very practical manner with its top layer is characterized in that the conductor track is provided with the top layer, that a layer of the oxidation-preventing material is provided on the metal layer formed on the surface, and in that then both juxtaposed layers are etched into the same pattern corresponding to the conductor track. Both the layer of metal and the layer of oxidation-preventing material can be deposited by means of a sputter deposition process. Both layers may be deposited in the same machine during a single processing step.

Further, preferably the layer of the oxidation-preventing material is first patterned by etching, whereupon the underlying metal layer is given the same pattern by etching while masking the pattern in the layer of oxidation-preventing material. The top layer then forms a very thin mask having a thickness of, for example, 5 nm, as a result of which the underlying metal layer can be satisfactorily wetted by a liquid etchant through the openings in this mask. As a result, for example, comparatively narrow conductor tracks may be formed, which are spaced apart by less than 1 $\mu$m. The layer of metal may be etched, for example, very selectively with respect to a top layer of amorphous silicon in a solution of hydrogen peroxide.

Preferably, the conductor track is further formed in a layer of tungsten to which titanium and nitrogen are added. By addition of nitrogen to the mixture of tungsten and titanium, lateral oxidation of the metal layer during the deposition of the silicon oxide layer is strongly counteracted. The conductor track would be oxidized much more strongly on its sides not covered by the top layer with this addition than without this addition. The conductor track would consequently have a frayed edge, which is also avoided by the addition of nitrogen.

DETAILED DESCRIPTION OF THE INVENTION

For a more complete understanding, the invention will now be described by reference to the figures of the drawing which show diagrammatically a few successive stages in the manufacture of a semiconductor device obtained according to the method of the invention. The starting material is a semiconductor body 1 having a surface 2 adjoined by a p-type conducting silicon semiconductor region 3 and a field oxide region 4 enclosing the semiconductor region. The field oxide region 4 can be obtained in a usual manner by local oxidation of silicon. It may also be formed by filling a groove etched into the body with silicon oxide. The surface 2 may be located, as in this example, above the semiconductor region 3 and above the field oxide region 4 at the same level; however, it may also be located above the field oxide region 4 at a higher level than above the semiconductor region 3. In the first case shown, the term "sunken field oxide" is sometimes used.

In the drawing, a single semiconductor region 3 enclosed by a field oxide region 4 is shown; however, in practice a semiconductor body may comprise a very large number of such regions. Each of these regions may then comprise, for example, a circuit element, such as a field effect transistor. In the example given here, a field effect transistor is provided in the semiconductor region 3.

In a usual manner, a gate electrode 6 of polycrystalline silicon isolated by a layer of gate oxide 5 from the semiconductor region 3 is provided on the surface 2. In the drawing, a conductor track 7 of polycrystalline silicon is also shown, which is disposed on the field oxide region 4. This conductor track 7 constitutes, for example, the same material as the gate electrode of a field effect transistor, which is provided in an adjacent semiconductor region. After the gate electrode 6 and the conductor track 7 have been formed, semiconductor zones 8 and 9 are formed by a usual implantation with $BF_2^+$ ions at an energy of about 55 keV and a dose of about $2 \times 10^{15}$ ions/cm$^2$. The gate electrode 6 and the field oxide region 4 serve as an implantation mask. The semiconductor zones 8 and 9 can now be used as source and drain zones of the field effect transistor. After the semiconductor zones 8 and 9 have been formed, the gate electrode 6 and the conductor track 7 are provided with an isolation edge 10 by depositing a silicon oxide layer on the whole body 1 and by then subjecting the layer to an anisotropic etching treatment for such a time that only the isolation edge 10 remains of this layer.

In order that the semiconductor zones 8 and 9 having a low electrical resistance can be contacted, these zones 8 and 9 are preferably provided with a top layer 12 of a metal silicide. This is effected by covering the whole body 1 by a layer 11 of metal which can form a silicide with silicon, in this example by an about 40 nm thick layer of titanium, after which the substrate 1 is heated in a nitrogen atmosphere for 10 seconds at 650° C. At the area at which the metal layer 11 is in contact with silicon, titanium silicide is formed, while at the area at which the metal layer lies on silicon oxide, titanium nitride is formed. Subsequently, the titanium nitride formed is removed in a solution of ammonia and hydrogen peroxide in water. The substrate 1 is then heated for 10 further seconds in the nitrogen atmosphere at 850° C. The semiconductor zones 8 and 9, the gate electrode 6 and the conductor of polycrystalline silicon 7 are then provided with a stable top layer 12 of titanium silicide having a resistance of 2.5 to 3.5 $\Omega$ per square. The isolation edge 10 of the gate electrode 6 and of the conductor 7 and the field oxide region 4 are free from titanium silicide.

Figure 7:
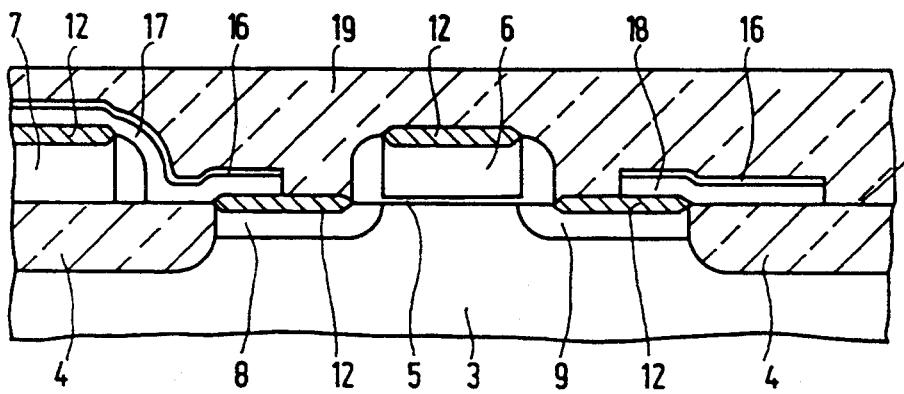
Figure 8:
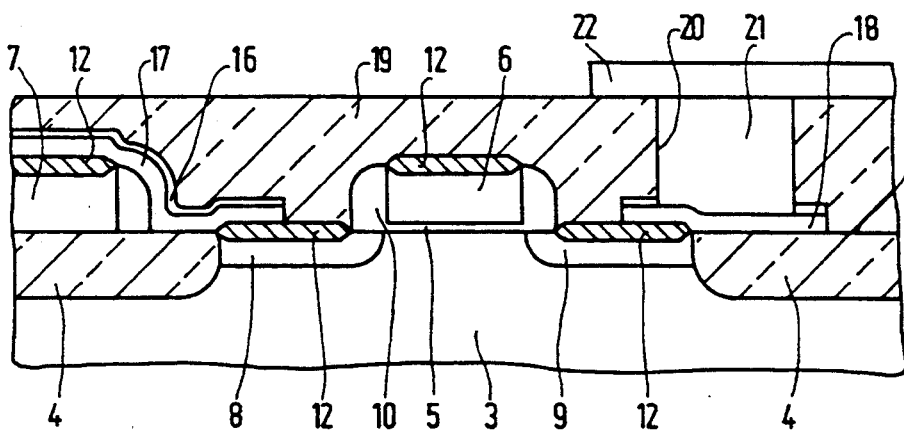

After the top layer 12 of titanium silicide has been formed, metal conductor tracks 17, 18, which are shown in FIGS. 7 and 8, are provided on the surface 2 of the semiconductor body, which is adjoined by the semiconductor zones 8 and 9 formed in the semiconductor region 3 and the field oxide region 4 and on which in the example the gate electrode 6 and the conductor of polycrystalline silicon 7 have already been provided. An isolating layer of silicon oxide 19 is deposited over the conductor tracks 17, 18 on the surface 2. The conductor track 17 extends above the semiconductor zone 8, above the field oxide region 4 as well as above the polycrystalline conductor 7 and connects the semiconductor zone 8 to the conductor 7. The conductor track 18 extends above the semiconductor zone 8 and the field oxide region 4 and is connected through a window 20 in the layer of silicon oxide 19 and a metal plug 21 provided in the window 20 to a further conductor 22 provided on the silicon oxide layer 19.

The metal conductor tracks 17, 18 are formed on the surface 2 by depositing a metal layer 13 (FIG. 5) on the surface 2 and by then etching this layer into a pattern corresponding to the conductor tracks 17, 18. According to the invention, before the silicon oxide layer 19 is provided over the conductor tracks 17, 18, these tracks 17, 18 are provided with a top layer 16 of an oxidation-preventing material see FIG. 6.

The isolating layer of silicon oxide 19 must be provided by means of a process by which a layer can be deposited, which has a very good step coverage. During such a process, the semiconductor body 1 is heated to a temperature lying above 650° C., while a silicon-containing gas mixture, such as, for example, tetraethoxy silane $Si(OC_2H_5)_4$ or a mixture of dichlorosilane $SiH_2Cl_2$ and oxygen, is passed over the semiconductor conductor body. The conductive track 17, 18 of titanium, vanadium, chromium, zirconium, niobium, molybdenum, hafnium, tantalum or tungsten or an alloy thereof readily oxidize in these conditions. Even in the first example, the gas mixture contains a sufficient quantity of oxygen to this end. A conductor track of such a metal, which, because it is capable of withstanding a high temperature, is further very suitable to be provided under a layer of silicon oxide, can then have comparatively high resistance or possibly even an electrical interruption. At much lower temperatures lying below 450° C., the metals practically do not oxidize even in an oxidizing gas mixture, but at such low temperatures a layer of silicon oxide having a good step coverage cannot be provided. Due to the oxidation-preventing top layer 16, it is achieved that a layer of silicon oxide can be deposited over the conductor track with a very good step coverage.

Preferably, the conductor tracks 17, 18 according to the invention are provided with a top layer 16 of amorphous silicon as oxidation-preventing top layer. Such a top layer can readily be deposited at a temperature below 450° C. by means of a usual sputter deposition process or by means of a deposition process in which the amorphous silicon is deposited from a vapour containing monosilane $(SiH_4)$. In the second case, the metal surface acts as a catalyst for the decomposition reaction of monosilane, which can consequently take place at a temperature of less than 450° C. During these processes, the aforementioned metals do not oxidize. It has been found that the top layer of amorphous silicon itself practically does not oxidize during the deposition of the silicon oxide by means of one of the aforementioned processes having a good step coverage. It has also been found that such a top layer is so dense that an oxidation of the underlying metal cannot be observed in practice.

Preferably, the oxidation-preventing top layer 16 of amorphous silicon has a thickness of at least 3 nm. A layer having such a thickness protects the underlying metal sufficiently from oxidation.

Figure 5:
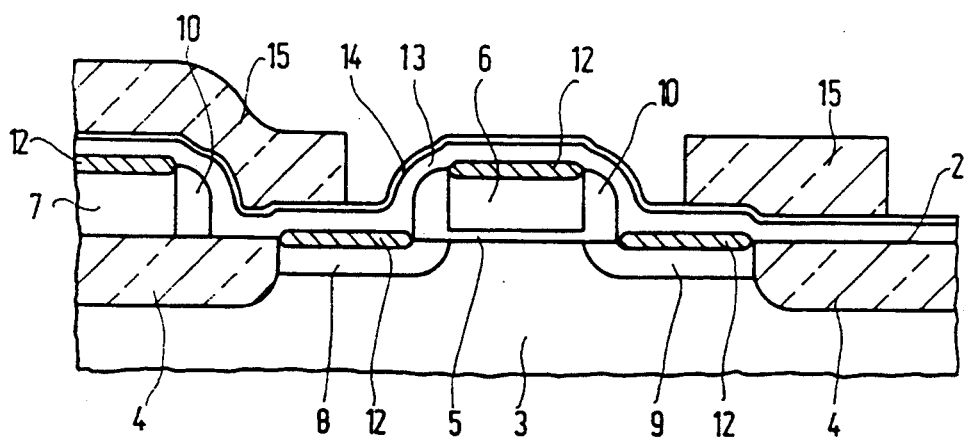
Figure 6:
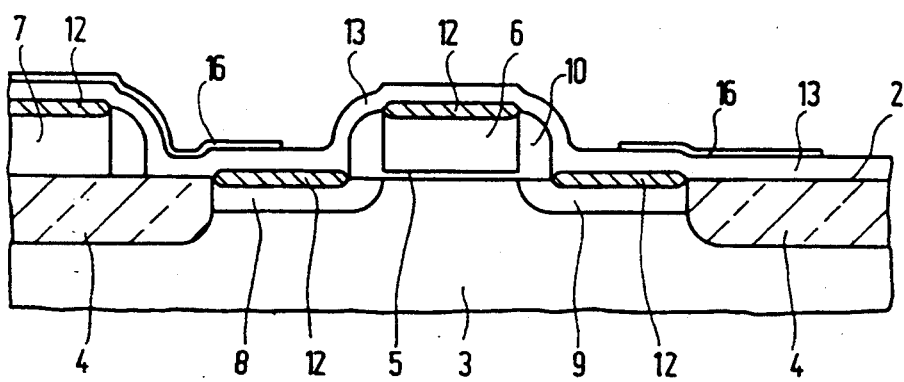

The metal conductor tracks 17, 18 are provided with the oxidation-preventing top layer 16 by depositing on the surface 2 of the body 1 a layer of metal 13, for example of titanium, vanadium, chromium, zirconium, niobium, molybdenum, hafnium, tantalum or tungsten or a mixture thereof, for example by means of a usual sputter deposition process, after which the metal layer is covered by a layer 14 of the oxidation-preventing material see FIG. 5. Subsequently, both layers are etched into a pattern corresponding to the conductor track 17 while masking with a photoresist mask 15 provided in a usual manner. Preferably, the layer 14 of the oxidation-preventing material is first etched into this pattern. The part 16 (FIG. 6) remaining of the layer of oxidation-preventing material is then used, after removal of the photoresist mask 15, as a mask during the step of etching the underlying metal layer 13 into the same pattern. Thus, the conductor track 17 with the oxidation-preventing top layer 16 is formed. The oxidation-preventing layer 14, which in this example is a layer of amorphous silicon, can be etched very selectively with respect to the metal layer 13 by a plasma formed in a gas mixture containing tetrafluorocarbon $(CF_4)$ and oxygen. The metal layer 13, which in this example consists of a nitrogen-containing alloy of titanium and tungsten, can be etched selectively with respect to amorphous silicon and the materials: metal silicide and silicon oxide, lying under the metal layer 13 can be etched by a solution of hydrogen peroxide. Since the layer 14 constitutes a very thin mask having a thickness lying between 3 and 50 nm, the metal layer 13 is wetted very satisfactorily on the uncovered parts. Therefore, conductor tracks can be obtained at very small relative distances (less than 1 μm).

The metal layer 13 of the nitrogen-containing mixture of titanium and tungsten, which contains titanium and tungsten in a ratio of 1:4 and which further contains 10 to 30 at. % of nitrogen, has, for example, a thickness of 100 nm, while the layer of amorphous silicon 14 has a thickness of more than 3 nm. This layer is deposited, for example, by sputtering a target containing titanium and tungsten in the ratio of 1:4 at a temperature of 150° C. and a pressure of mTorr in a gas containing argon and nitrogen, which contains at most 25% by volume of nitrogen. Nitrogen is then incorporated for at most 30 at. % into the layer. By the addition of nitrogen in the layer 13, during the following depositions of a layer of silicon oxide 19 over the whole substrate lateral oxidation of the metal layer is strongly counteracted. If the lateral oxidation of the layer of the mixture of titanium and tungsten without nitrogen should be 300 nm, the lateral oxidation of an equally thick layer of such an alloy with nitrogen would be only 140 nm.

The silicon oxide layer 19 is provided on the substrate 1 by heating it to a temperature of about 700° C. in a gas atmosphere of tetraethoxy silane. Subsequently, this layer is planarized in a usual manner. Finally, the silicon oxide layer 19 is provided with a contact window 20. This window 20 lies entirely above the conductor track 18, which has the additional advantage that during the step of etching it the underlying field oxide 4 cannot be damaged because the conductor track 18 can then serve as an etch stopper.

The contact window 20 is then filled in a usual manner with metal 21, for example tungsten, by depositing it selectively on the conductor track 18 or by covering the substrate 1 entirely with a thick metal layer and then etching it away again down to the silicon oxide layer, the contact window then remaining just filled. On the silicon oxide layer 19 an additional metal layer 22 of, for example, aluminum is provided, which is then in electrical contact via the metal 21 in the contact window 20, the metal conductor 18 and the metal silicide layer 12 with the semiconductor zone 9.

Figure 3:
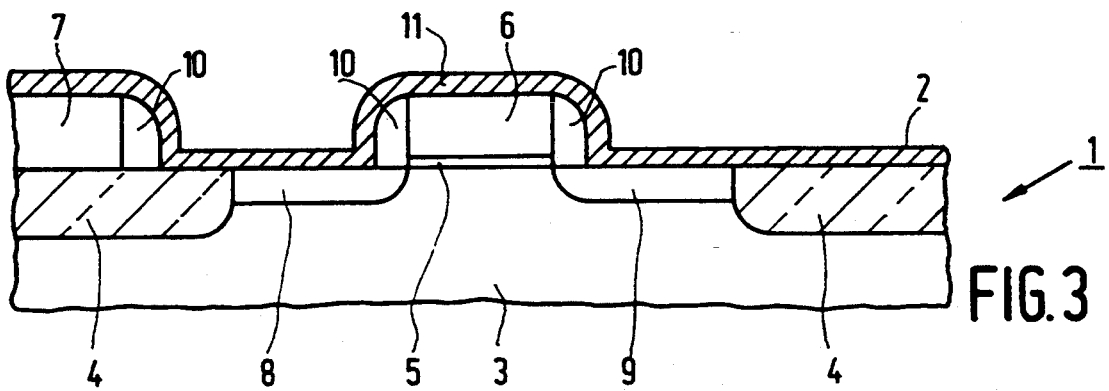
Figure 4:
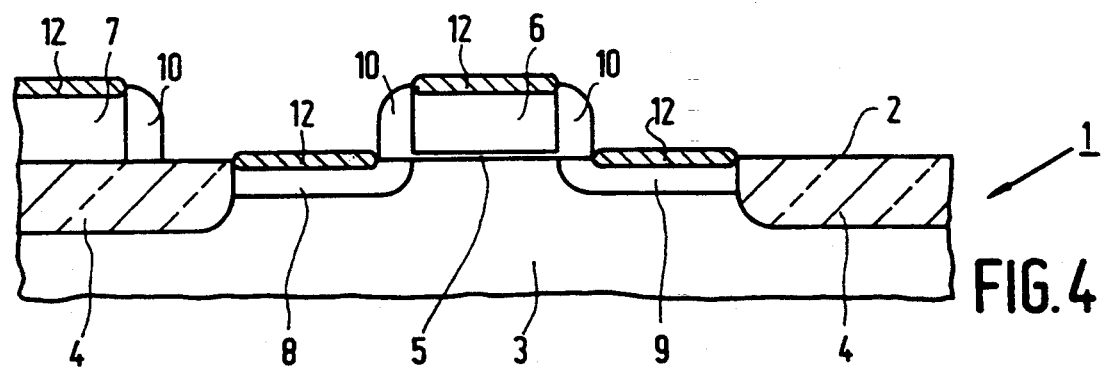

The metal layer 13, in which the conductor track 17, 18 is formed, is preferably provided after the metal silicide top layer 12 has been formed on the semiconductor zones 8, 9 and on the polysilicon gate electrode 6 and the polysilicon conductor track 7. The order of succession may also be different. For example, the metal layer 13 may first be provided on the metal layer 11 (FIG. 3) forming metal silicide, whereupon the silicidation treatment is carried out. This treatment should then be such that the lower metal layer 11 forms a metal silicide with underlying silicon, while the upper metal layer 13 then remains unchanged. Subsequently, the conductor track may be formed in the upper metal layer, after which uncovered parts of the underlying metal layer 11 which have not been converted into a metal silicide are removed. However, in contrast with the method described above, this method has the disadvantage that during the silicidation treatment silicon diffuses from the semiconductor zones, 8, 9 through the silicide already formed and forms a silicide with not yet reacted metal. In this manner, a metal silicide may also be formed above silicon oxide, such as, for example, on the side isolations 10 of the gate electrode 6. As a result, undesired electrical shortcircuits may be formed. Such an overgrowth of metal silicide is avoided in the method according to the invention. As described, metal silicide is then formed in a nitrogen atmosphere within a very short time. At areas at which no silicon is present under the metal layer 11, this layer is converted into a metal nitride. This metal constitutes a very good diffusion barrier for silicon so that the overgrowth of metal silicide described above is strongly suppressed. The metal silicide is preferably formed by means of a heat treatment at a temperature lying between 600° and 700° C. for a time of 5 to 20 seconds in a nitrogen-containing atmosphere.

It will be appreciated that the method according to the invention is not limited to the embodiment described here, but that within the scope of the invention many further variations are possible. For example, the formation of a field effect transistor in the semiconductor region 3 has been described, but of course another circuit element may also be provided here, such as, for example, a bipolar transistor.

What is claimed is:

1. A method of manufacturing a semiconductor device comprising the steps of
    (a) forming a layer of at least one semiconductor region and at least one field oxide region within a semiconductor body, said field oxide region surrounding said semiconductor region,
    (b) forming conductive tracks from a metal layer formed from a nitrogen-containing alloy of titanium and tungsten in which the atomic ratio of titanium to tungsten is 1:4 and the atomic percent of nitrogen is 10%–30% at a surface of said semiconductor body, said conductive tracks contacting semiconductor regions of said semiconductor body,
    (c) forming a layer of an oxidation-preventing material of amorphous silicon with a thickness ranging from 3 nm to 50 nm on said conductive tracks to prevent oxidation of said conductive tracks, and
    (d) thereafter exposing said layer of amorphous silicon to a gas containing silicon and oxygen while heating said body at a temperature above 650° C. to thereby form a layer of silicon oxide on said layer of amorphous silicon.

2. A method according to claim 1, wherein said steps (b) and (c) are carried out by depositing said metal layer over said surface of said semiconductor body, by depositing said oxidation-preventing material of amorphous silicon on said metal layer, and by then etching both said metal layer and said oxidation-preventing material into a pattern corresponding to said conductive tracks and said oxidation-preventing material.

3. A method according to claim 2, wherein said oxidation-preventing material of amorphous silicon is first etched into said pattern, and then said metal layer is etched into said pattern by using the etched pattern of said oxidation-preventing material as a mask.

4. A method according to claim 2, wherein said semiconductor region is provided at least locally with a top layer of metal silicide before carrying out said step (b).

5. A method according to claim 4, wherein said top layer of metal silicide is formed by a heat treatment at a temperature lying between 600° and 700° C. for a time of 5 to 20 seconds in a nitrogen-containing atmosphere.

6. A method according to claim 1, wherein said semiconductor region is provided at least locally with a top layer of metal silicide before carrying out said step (b).

7. A method according to claim 6, wherein said top layer of metal silicide is formed by a heat treatment at a temperature lying between 600° and 700° C. for a time of 5 to 20 seconds in a nitrogen-containing atmosphere.

8. A method according to claim 1, wherein said step (c) is carried out at a temperature below 450° C.

9. A method according to claim 8, wherein said step (c) is carried out by a sputter deposition process.

10. A method according to claim 8, wherein said step (c) is carried out by vapor deposition.

* * * * *